SEMICONDUCTOR DEVICE FOR AND METHOD OF MANUFACTURING THE SAME
Filed Aug. 30, 1967 4 Sheets-Sheet 1

INVENTORS

MASAYUKI YAMAMOTO
HISASHI TOKI, HIDEO SHIBUYA

BY Craig & Antonelli
ATTORNEYS

INVENTORS
MASAYUKI YAMAMOTO,
HISASHI TOKI, HIDEO SHIBUYA

BY Craig & Antonelli
ATTORNEYS

INVENTORS
MASAYUKI YAMAMOTO,
HISASHI TOKI, HIDEO SHIBUYA

BY Craig & Antonelli
ATTORNEYS

INVENTORS
MASAYUKI YAMAMOTO,
HISASHI TOKI, HIDEO SHIBUYA

BY Craig & Antonelli
ATTORNEYS

United States Patent Office 3,697,334

Patented Oct. 10, 1972

3,697,334

SEMICONDUCTOR DEVICE FOR AND METHOD OF MANUFACTURING THE SAME

Masayuki Yamamoto, Hisashi Toki, and Hideo Shibuya, Kodaira-shi, Japan, assignors to Hitachi, Ltd., Tokyo, Japan Filed Aug. 30, 1967, Ser. No. 664,461
Claims priority, application Japan, Sept. 2, 1966, 41/57,558; Sept. 12, 1966, 41/59,837; Mar. 24, 1967, 42/17,991
Int. Cl. H01l 3/14
U.S. Cl. 148—33.3 41 Claims

ABSTRACT OF THE DISCLOSURE

A semiconductor device comprising a silicon substrate, an insulating film containing silicon oxide and phosphorus oxide which is formed on the surface of said silicon substrate, and a protective coating containing aluminum oxide which is formed on the insulating film.

This invention relates to a semiconductor device, and more particularly it pertains to a semiconductor device having its surface covered with a protective film such as a diode, transistor and the like and to a method of manufacturing such semiconductor device.

Figure 1A:
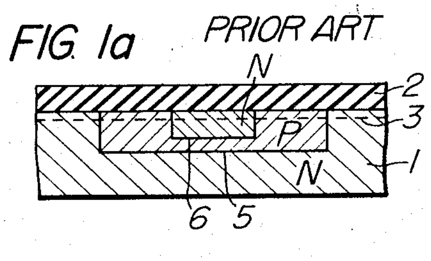
FIG. 1a PRIOR ART

It is well known in the art to cover the surface of a semiconductor element with an oxide film for the purpose of protecting the element from the external atmosphere. FIG. 1*a* shows an example of a silicon transistor, wherein the surface of a semiconductor substrate 1 is covered with an oxide film 2 so that the surfaces of the base and emitter regions and the ends of an emitter junction 6 and a collector junction 5 formed in the semiconductor substrate are isolated from the outside so as to be free from any influence of the environmental atmosphere. Such oxide film 2 is ordinarily formed by two alternative methods, that is, high temperature oxidation method and thermal decomposition method.

In the high temperature oxidation method, a semiconductor substrate is subjected to heat treatment at a temperature of 1000° C. or higher while it is exposed to an oxidizing atmosphere so that an oxide film is thermally produced from the semiconductor substrate. In the thermal decomposition method, organooxysilane such as tetraethoxysilane or the like is thermally decomposed at a relative low temperature of about 750° C. to cause an oxide film to be deposited on the surface of a substrate. The former method is advantageous in that the resulting oxide film is very dense. On the other hand, the latter method has the advantage that an oxide film can be produced at a low temperature as compared with the former method or high temperature oxidation method so that the influence of heat on a semiconductor substrate can be reduced. Therefore, these two methods have selectively been applied to the manufacture of semiconductor elements, as desired.

However, an oxide film thus formed on the surface of a semiconductor substrate will inevitably have an effect upon a resultant semiconductor element regardless of which method is used. This is a phenomenon referred to as "channel phenomenon" by which a donor level is induced in the surface of the semiconductor substrate in contact with the oxide film. In the transistor as shown in FIG. 1*a*, a donor or carrier electron level as indicated by a dotted line 3 is induced in that portion of the surface of the substrate 1 which is in contact with the oxide film 2. In actual operation of such semiconductor element, a current flows through the channel portion so that the reverse leakage current increases to deteriorate the electrical characteristics of the element. It may be considered that the N conductivity type channel phenomenon is caused by the presence of positive charges such as sodium ions, oxygen vacancies or the like in the oxide film. Furthermore, it may be considered that positive or negative charges contained in the oxide film are enabled to easily move within the oxide film due to the heat treatment effected during the process of manufacturing an element or due to a bias voltage applied to such element during the operating of the latter, thus inducing a variable quantity of electrons or holes in the substrate surface so that an unstable channel is formed. From this, it will be noted that while the presence of an oxide film is effective in the protection of the element surface from the external atmosphere, it will have a great adverse effect on the internal portion of the element.

Figure 1B:
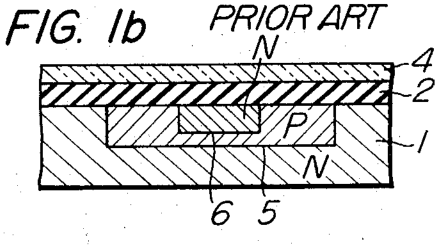
FIG. 1b PRIOR ART

Recently, an attempt has been made to eliminate the above drawbacks by vitrifying the surface of such oxide film thereby to stabilize the semiconductor surface. In this method, an element is subjected to heat treatment while being placed in a phosphorus atmosphere to vitrify the surface of the silicon oxide film with a phosphorus oxide (perhaps, $P_2O_5$). It is considered that the charges in the oxide film 2 are adsorbed to the phosphorus oxide (perhaps, $P_2O_5$) of a high chemical activation degree and fixed thereto, and thereby the surface energy state of the substrate is stabilized. FIG. 1*b* shows the case where the surface portion of the oxide film 2 was vitrified with phosphorus oxide. However, such phosphorus oxide has the property of actively reacting with the external atmosphere and absorbing a moisture or the like from the outside. Therefore, on the contrary, such vitrification results in stability of the surface and increases the leakage current as is the case with a non-vitrified oxide film.

Accordingly, it is an object of this invention to provide a semiconductor device having a new and improved protective coating applied thereon so as to avoid one or more of the aforementioned disadvantages of the prior art.

It is another object of this invention to provide a method of applying a new and improved protective coating to the surface of a semiconductor body.

Still another object of this invention is to provide a semiconductor device comprising a semiconductor substrate, an insulating film containing phosphorus oxide which is formed on the semiconductor substrate, and a layer containing aluminum oxide and/or boron oxide which is provided on the insulating film, thereby eliminating the aforementioned disadvantages of the prior art.

In accordance with one embodiment of the present invention, the protective coating covering the surface of a semiconductor body is formed mainly of silicon oxide, phosphorus oxide and aluminum or boron oxide, and the deterioration in the characteristics due to water absorption of the phosphosilicate glass layer as in the prior art can be prevented through the use of a layer formed by a mixture of phosphorus oxide and aluminum or boron oxide or a layer formed of aluminum or boron oxide. In accordance with another embodiment of this invention, such protective coating is produced by forming a silicon oxide film on the surface of a semiconductor body, providing a layer containing phosphorus oxide or phosphorus oxide and silicon oxide on the outside of the silicon oxide film, and thereafter combining aluminum or boron oxide with this layer.

A semiconductor device having greatly improved water resisting and electrical characteristics over those of the prior art semiconductor devices can be produced by the present invention because of the fact that the phosphorus oxide contained in the protective coating serves to stabilize the semiconductor surface and the layer containing aluminum or boron oxide prevents the penetration of moisture from the outside and the reaction of the phosphorus oxide with moisture.

Figure 2:
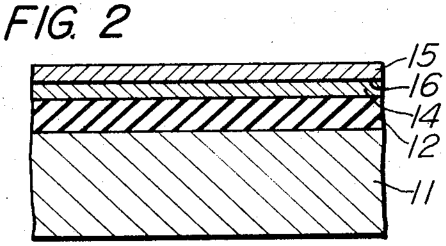
Figure 4:
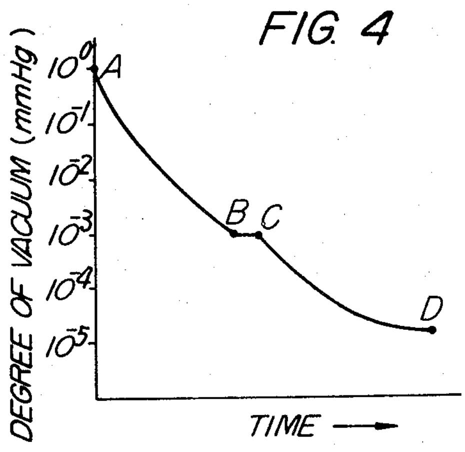
Figure 6A:
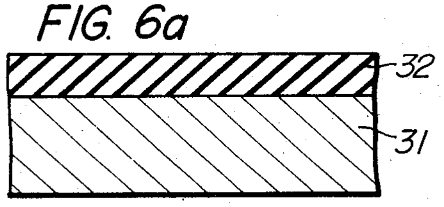
Figure 5A:
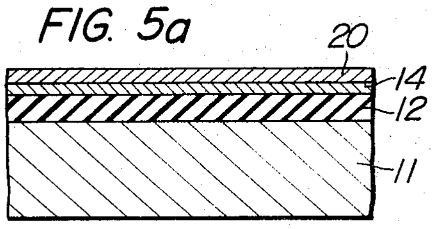
Figure 6B:
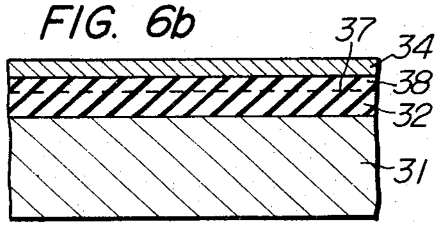
Figure 5B:
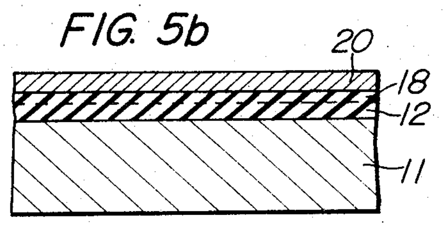
Figure 6C:
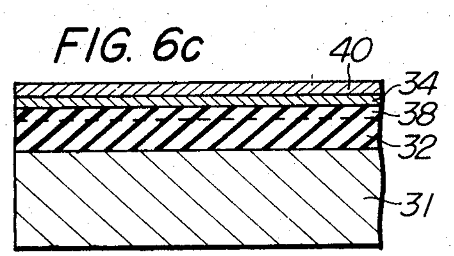
Figure 5C:
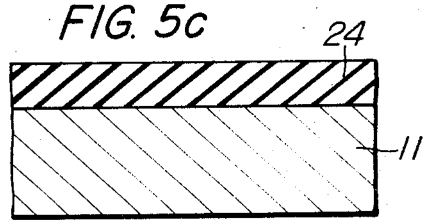
Figure 7A:
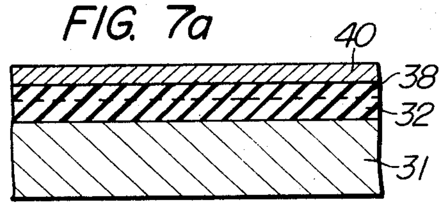
Figure 8A:
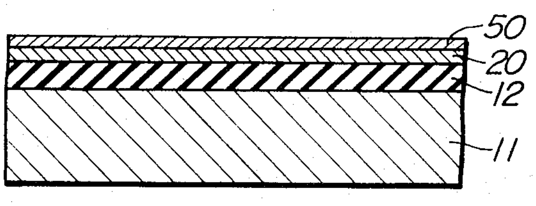
Figure 8B:
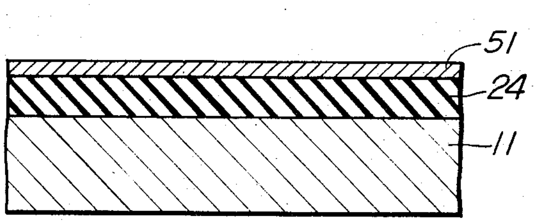

The foregoing and other objects, features and advantages of this invention will become apparent from the following description taken in conjunction with the accompanying drawings, in which:

FIGS. 1*a* and *b* are sectional views illustrating examples of semiconductor devices in the prior art;

FIG. 2 is a sectional view showing a typical example of the semiconductor device according to this invention;

FIGS. 3*a* to *e* are sectional views representing a portion of an array of semiconductor devices during the various steps in the manufacture thereof according to this invention;

FIG. 4 is a view for illustrating the steps of manufacture of the semiconductor device according to this invention;

FIGS. 5*a* to *c* are sectional views showing other examples of the semiconductor device according to this invention respectively;

FIGS. 6*a* to *c* are sectional views representing a portion of another array of a semiconductor device during the various steps in the manufacture thereof according to this invention;

FIGS. 7*a* and *b* are sectional views showing still another example of the semiconductor device according to this invention respectively;

FIGS. 8*a* and *b* are cross-sectional views showing furthers examples of the semiconductor device according to this invention respectively;

FIGS. 9*a* to *d* are sectional views representing a portion of still another array of a semiconductor device during the various steps in the manufacture thereof according to this invention; and FIGS. 10*a* to *j* are diagrams showing various forms of the semiconductor device according to this invention, for the simplicity of explanation thereof.

Referring to FIG. 2, there is shown an example of the semiconductor device according to the present invention, which comprises a semiconductor substrate 11, a silicon oxide layer 12 provided on the surface of the semiconductor substrate 11, a layer 14 containing phosphorus oxide or phosphorus oxide and silicon oxide, and a layer 15 of aluminum or boron oxide provided on the layer 14, whereby a layer 16 is interposed between the layer 14 and the layer 15 so that the layers 14 and 15 are bonded to each other through the layer 16. In the drawing, a PN junction formed in the substrate is omitted. It has been found that such a semiconductor device is advantageous over the prior art ones as shown in FIGS. 1*a* and *b* in respect of reliability, especially water resisting property.

EXAMPLE 1

A detailed description will now be made of an example of the method of manufacturing the semiconductor device according to this invention with reference to FIGS. 3*a* to *e*.

Figure 3A:
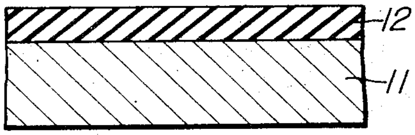

First of all, a silicon oxide film 12 at least 3000 A. in thickness is formed on the surface of a substrate 11, as shown in FIG. 3*a*. Such silicon oxide film 12 may be formed by a high temperature oxidation method, that is, it may be thermally produced from the substrate through heat treatment in an oxidizing atmosphere at an elevated temperature higher than 1000° C. However, in this experiment, use was made of the thermal decomposition method. That is, a silicon wafer was inserted into a reaction tube, and a silicon oxide film about 5000 to 6000 A. in thickness was formed by passing a tetraethoxysilane gas through the reaction tube while the wafer was heated up to about 740° C. The resulting film is considered to consist substantially of silicon dioxide ($SiO_2$). It is also possible to form such silicon oxide film by thermally decomposing monosilane, propoxysilane or methoxysilane.

Figure 3B:
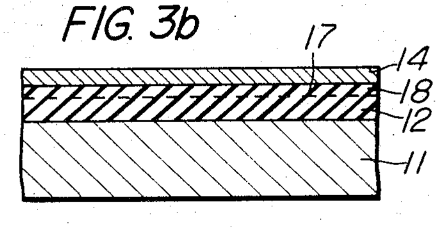

Subsequently, a layer 14 at least 50 A. in thickness consisting of phosphorus oxide or phosphorus oxide and silicon oxide is formed on the the silicon oxide film 12, as shown in FIG. 3*b*. This layer 14 was formed in a thickness of about 1000 A. by heating in a reaction tube the substrate 11 with the silicon oxide film 12 as shown in FIG. 3*a* up to 800° C., and supplying $POCl_3$ gas together with carrier gas of oxygen to the surface of the substrate for about one hour. In this case, a layer consisting substantially of phosphorus oxide is formed on the silicon oxide film 12 provided on the substrate 11, and the phosphorus oxide is introduced into the silicon oxide film as indicated by a dotted line 17 in FIG. 3*b*, with the result that a layer 18 consisting of phosphorus oxide and silicon oxide about 200 to 300 A. in thickness is formed. In this case, while the aforementioned lever 18 is vitrified, the layer 14 may be formed as phosphorus oxide which is not completely vitrified. It may be considered that this phosphorus oxide consists substantially of $P_2O_5$. Although $POCl_3$ was used to form the layer 14, use may be made of a phosphorous compound such as $PCl_3$, $PBr_3$, $PCl_5$, $PH_3$ or $PBr_5$ instead of $POCl_3$.

Figure 3C:
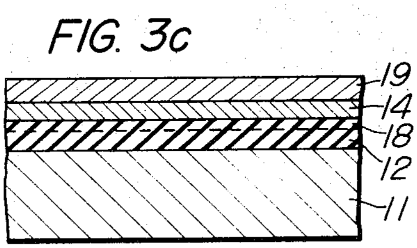
Figure 3C:
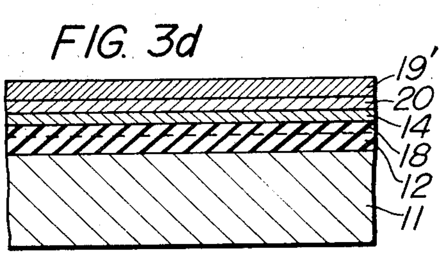
Figure 3C:
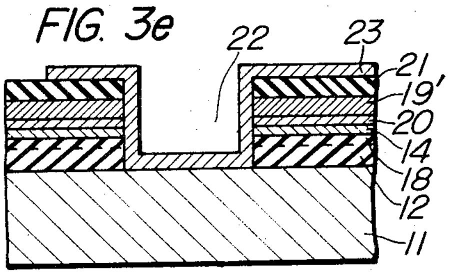

Next, an aluminum layer 19 is provided on the layer 14, as shown in FIG. 3*c*.

The aluminum layer 19 was formed with a thickness of about 500 A. to 1000 A. by vacuum-depositing aluminum in a vacuum of $10^{-2}$ to $10^{-6}$ mm.-Hg for about to 1 to 5 minutes. If the degree of vacuum is low, the layer 19 may contain aluminum oxide, but such aluminum oxide will have no adverse effect.

Thereafter, the semiconductor substrate 11 having the aluminum layer 19 is heated in an oxidizing atomsphere at about 620° C. for 5 to 60 minutes (preferably, for 30 minutes) to oxidize aluminum thereby forming aluminum oxide layer 19'. Simultaneously, the aluminum oxide is caused to react with the layer 14 consisting of phosphorus oxide or phosphorus oxide and silicon oxide. As a result, there is formed a layer 20 containing phosphorus oxide and aluminum oxide, as shown in FIG. 3*d*. This layer 20 may consist of a mixture of silicon oxide, phosphorus oxide and aluminum oxide.

In this way, there is produced a semiconductor device provided with the surface protecting coating according to this invention. It is presumed that this aluminum oxide layer consists substantially of $Al_2O_3$. In case the layer 14 consisting of phosphorus oxide or phosphorus oxide, and silicon oxide has not completely been vitrified, the non-vitrified, phosphor oxide will be covered with aluminum oxide at the subsequent step. Thus, the water resisting property of a semiconductor device subjected to the treatment according to this invention is remarkedly improved.

In the case where a photo-etching technique is used to form apertures in the surface protecting coating of this invention for the purpose of providing electrodes extending to the surface of the semiconductor substrate, it is preferable to form a desired metal electrode layer 23 by forming a silicon oxide layer 21 about 1000 to 5000 A. in thickness on the aluminum oxide layer 19' by the thermal decomposition method described with reference to FIG. 3*a*, selectively irradiating light rays onto a photoresist material adhering to the silicon oxide layer 21, removing the photoresist attached to the portion having no light rays irradiated thereonto, thereafter dipping the semiconductor substrate into an etchant solution of which the main component is HF to form a hole 22 through which the semiconductor substrate is exposed, and vacuum-depositing an electrode metal layer such as aluminum on the exposed portion of the substrate, because the strength of adherence of the photo-resist material with respect to the aluminum oxide layer is low.

It has been found that when the aluminum layer 19 is formed through vacuum-deposition as illustrated with reference to FIG 3*c*, the thickness of the aluminum layer can be controlled so as to be as much as several hundred A. by evaporating aluminum while gradually increasing the degree of vacuum in the vacuum furnace.

With reference to the drawings, description will now be made of an example to effect the aforementioned control. A silicon substrate covered with an insulating film containing phosphorus oxide in the surface thereof as illustrated in FIG. 3*b* is placed in a vacuum-deposition furnace. Aluminum of about 30 mg. in the form of wire is used as a metal to be evaporated, and it is wound on the evaporating filament of the vacuum-deposition furnace. In such a state, the furnace is operated in accordance with such a program as shown in FIG. 4. That is, the furnace is first evacuated by means of a rotary oil pump so that a degree of vacuum in the neighborhood of $10^{-3}$ mm. Hg is reached during the period of time from A to B. At this time, the evaporation treatment is not yet effected. Subsequently, the evacuating operating is stopped during the time B to C (about 30 seconds), and various kinds of dust sticking to the evaporation source of aluminum during the evacuation process are removed by heating the evaporation source to such an extent that no evaporation is caused. Thereafter, evacuation is again initiated by operating an oil diffusion pump, as indicated by C–D, and the aluminum evaporation treatment is effected for about 5 minutes to deposit aluminum on the element surface with a thickness of several hundred A. Then, the element is subjected to heat treatment in an oxidizing atmosphere in order to cause aluminum deposited on the element surface to react with the layer consisting phosphorus oxide or phosphorus oxide and silicon oxide. The experimental results obtained by the inventors show that the aforementioned heat treatment is effective if it is carried out at a temperature higher than 620° C. However, there is no special need to fix the upper limit of the temperature range. It is only required that such upper limit be a value that has no effect upon the semiconductor element during the steps in the manufacture thereof, for example, 1000° C. or lower. In case that the upper limit of the temperature range is selected to be higher than this value, there will occur the phenomenon that aluminum, phosphorus or the like is caused to penetrate into the substrate. The time for such treatment may be 30 minutes, for example.

In this way, there has been produced a semiconductor device with the insulating coating having such construction as shown in FIG. 3*d*. That is, the reference numeral 11 represents a silicon substrate, 12 a silicon oxide film, 14 a layer consisting of phosphorus oxide or phosphorus oxide and silicon oxide, 20 a layer consisting of aluminum oxide and phosphorus oxide which is formed on the surface of the layer 14, and 19' an aluminum oxide film.

The thickness of each layer is given by way of example as follows: the silicon oxide layer 12 is 5000 to 6000 A.; the layer 14 is 100 to 300 A.; the layer 20 consisting of aluminum oxide and phosphorus oxide is 100 to 200 A.; and the aluminum oxide film 19' is several hundred A.

If the deposited aluminum layer is too thin or the quantity of aluminum is too small, almost all aluminum oxide reacts with phosphorus oxide or silicon oxide when this aluminum is oxidized at the subsequent step, with a result the layer 20 consisting of aluminum oxide and phosphorus oxide is formed on the layer 14 consisting of phosphorus oxide or phosphorus oxide and silicon oxide, as shown in FIG. 5*a*. If the thickness of the layer 14 is small or the quantity of phosphorus contained in the layer is smaller than that of aluminum deposited on the layer, a layer 20 consisting of a mixture of phosphorus oxide and aluminum oxide is formed directly on a layer 18 consisting of phosphorus oxide and silicon oxide, as shown in FIG. 5*b*. In this case, the mixture layer 20 many contain silicon oxide, and it may have been vitrified. Still, a layer consisting of silicon oxide and aluminum oxide may be formed between the silicon oxide layer 12 and the mixture layer 20 consisting silicon oxide, phosphorus oxide, and aluminum oxide, by the diffusion of aluminum or aluminum oxide into the silicon oxide layer 12.

By continuing to heat the semiconductor device as shown in FIG. 5*b*, silicon oxide, phosphorus oxide and aluminum oxide started to react with each other, and finally a mixture layer 24 consisting of silicon oxide. phosphorus oxide and aluminum oxide was formed directly on the surface of the substrate 11, as shown in FIG. 5*c*.

As a result of inspection, it has been proved that the semiconductor devices as shown in FIGS. 5*a* to *c*, like the semiconductor device as shown in FIG. 3*d*, are respectively the devices with stabilized semiconductor surface characteristics and an improved water resisting property, which the invention primarily intends to provide.

As a result of the measurement of the characteristics of each of the aforementioned semiconductor devices and the subsequent analysis of the components of the surface coating provided on each semiconductor device, it has been found that in the semiconductor devices as shown in FIG. 3*d*, FIG. 5*a* and FIG. 5*b* wherein the mixture layer of aluminum oxide and phosphorus oxide is provided on silicon oxide layer, the semiconductor surface stability and water resisting property thereof are greatly improved when the quantity of aluminum in the mixture layer of aluminum oxide and phosphorus oxide is not less than three times that of phosphorus therein on the basis of atomic percent.

It is has also been found that in the semiconductor device as shown in FIG. 5*c* wherein the mixture layer of silicon oxide, phosphorus oxide and aluminum oxide is provided on the surface of the silicon substrate, the quantity of aluminum in the mixture layer is preferably not more than that of phosphorus therein on the basis of atomic percent. Furthermore, it has been proved that if aluminum oxide is contained in the insulating film at 1 weight percent or more, preferably at 4 weight percent or more, there can be produced a semiconductor device with an excellent water resisting property, the provision of which constitutes the primary object of this invention.

EXAMPLE 2

By using boron oxide instead of aluminum oxide used in Example 1 described above and combining the boron oxide with an insulating film containing phosphorus oxide, a semiconductor device having a very excellent water resisting property, like the aforementioned semiconductor devices, was produced.

Such semiconductor device will now be described with reference to FIGS. 6*a* to *c*.

A silicon oxide layer 32 about 8000 A. in thickness is formed on the surface of a silicon substrate 31 by a method similar to that described with reference to FIG. 3*a*, that is, by thermally decomposing tetraethoxysilane, as shown in FIG. 6*a*.

Subsequently, as shown in FIG. 6*b*, a layer 34 consisting of phosphorus oxide or phosphorus oxide and silicon oxide about 1000 A. to 2000 A. in thickness is formed on the surface of the silicon oxide layer 32, as in the case of FIG. 3*b*. In this case, a layer 38 consisting of phosphorus oxide and silicon oxide may be formed in the silicon oxide layer 32 due to introduction of phosphorus oxide into the silicon oxide layer 32 during this treatment process.

Thereafter, the semiconductor substrate is subjected to heat treatment in an oxidizing atmosphere including boron at about 750° C. so that boron oxide is deposited on the surface of the layer 34. Thus, the boron oxide reacts with the layer 34 containing phosphorus oxide, with a result that a mixture layer 40 of phosphorus oxide and boron oxide is formed which is combined with the surface portion of the layer 34, as shown in FIG. 6*c*. If an excessive quantity of boron oxide is deposited, a layer of boron oxide is left on the mixture layer 40. As a result of various experiments, in the case where the quantity of the boron oxide is 1 to 10 weight percent, the layer 40 is stabilized and thus there is produced a semiconductor device with an excellent water resisting property. In this case, it is presumed that this boron oxide consists substantially of $B_2O_3$.

Figure 7B:
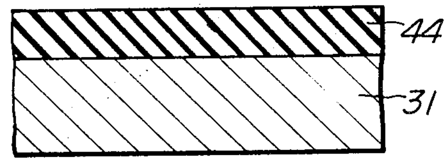

In some case, because of the reaction of the entire layer 34 with boron oxide during the formation of the mixture layer of phosphorus oxide and boron oxide, a semiconductor device as shown in FIG. 7*a* was produced wherein a layer 40 consisting of phosphorus oxide and boron oxide is formed directly on a layer 38 consisting of phosphorus oxide and silicon oxide. In the other case, because of the mutual reaction of silicon oxide, phosphorus oxide and boron oxide, a semiconductor device as shown in FIG. 7*b* was produced wherein a layer 44 consisting of silicon oxide, phosphorus oxide and boron oxide is formed directly on a silicon substrate 31. As a result of inspection, however, it has been found that these semiconductor devices as shown in FIGS. 7*a* and *b* also have a stabilized semiconductor surface characteristic and an improved water resisting property, like the semiconductor device as shown in FIG. 6*c*.

In the case the surface of the layer 34 containing phosphorus oxide or phosphorus oxide and silicon oxide of the semiconductor device as shown in FIG. 6*b* is not completely vitrified, the phosphorus oxide is completely covered with the boron oxide. Thus, the characteristics of the semiconductor device are greatly improved through the treatment according to this invention.

When it is required that holes are selectively formed in the surface coating as in Example 1, it is preferable to deposit a silicon oxide film on the surface coating by thermally decomposing tetraethoxysilane, thereafter apply a photo-resist material on the film and then selectively form the holes by the conventional photo-etching technique.

EXAMPLE 3

Although, in Example 1, aluminum was evaporated onto the layer 14 consisting of phosphorus oxide or phosphorus oxide and silicon oxide and thereafter the layer 20 containing phosphorus oxide and aluminum oxide was formed through the oxidation treatment, such layer 20 containing phosphorus oxide and aluminum oxide was also formed by depositing aluminum oxide rather than aluminum directly on the layer 14 in a thickness of at least 50 A.

That is, a semiconductor device having a surface coating as shown in FIG. 3*b* was heated to a temperature of 300 to 500° C. (preferably, 430° C.), and in this state triethoxyaluminum ($Al(OC_2H_5)_3$) was supplied thereto together with a carrier gas of $N_2$ and/or $O_2$ to thermally decompose the aluminum compound, thereby causing aluminum oxide to be deposited on the layer 14 containing phosphorus oxide provided on the semiconductor substrate. Thus, the semiconductor devices as shown in FIGS. 5*a* to *c* were produced. This method made it possible to form a uniform aluminum oxide layer as thick as, for example, 2000 A., and thus the water resisting property of the resultant semiconductor device was further improved. It is also possible to form such aluminum oxide film by thermally decomposing $$Al(C_2H_5)_3,\ Al(C_3H_7)_3,\ Al(CH_3)_3,\ (C_6H_5\cdot CH_2)_3Al$$

methoxyaluminum, propoxyaluminum or the like instead of triethoxyaluminum ($Al(OC_2H_5)_3$).

EXAMPLE 4

Description will now be made of a method of simultaneously depositing a layer of phosphorus oxide and that of aluminum oxide or boron oxide on silicon oxide.

First, a silicon oxide film about 5000 A. in thickness is formed on the silicon substrate by the method described with reference to FIG. 3*a* or FIG. 6*a*. Thereafter, the substrate is heated at about 300 to 800° C. (preferably, 400° C.) in a reaction tube. By simultaneously supplying $B_2H_6$ gas and $PH_3$ gas together with $O_2$ gas which is used as carrier gas for one hour, a layer consisting of phosphorus oxide and boron oxide is formed with a thickness of about 200 A. on the silicon oxide film. Thus, a semiconductor device with an improved water resisting property can be obtained. By subjecting the semiconductor device thus obtained to heat treatment at 600 to 700° C., a glass layer containing silicon oxide, phosphorus oxide and boron oxide as main constituents is formed in the silicon oxide surface portion, thus further improving the water resisting property of the semiconductor device.

In the case where a layer consisting of phosphorus oxide and aluminum oxide is to be formed on silicon oxide, a semiconductor substrate having a silicon oxide film about 5000 A. in thickness is heated at about 700° C. and then $POCl_3$ gas and $Al(OC_2H_5)_3$ gas are simultaneously supplied thereto together with $O_2$ gas used as carrier gas for two hours, resulting in a layer consisting of phosphorus oxide and aluminum oxide about 500 A. in thickness.

EXAMPLE 5

By combining the technique described in Example 1 or 3 with that described in Example 2, it is possible to obtain a semiconductor device with a further improved water resisting property.

That is, a semiconductor device produced by the method disclosed in Example 1 as shown in FIG. 5*b* or FIG. 5*c* is subjected to heat treatment at about 600° C. in an oxidizing atmosphere containing boron, with the result that boron oxide is deposited on the layer 20 containing phosphorus oxide and aluminum oxide or the layer 24 consisting of silicon oxide, phosphorus oxide and aluminum oxide. Consequently, the boron oxide combines with the phosphorus oxide or silicon oxide contained in the layer 20 or 24 to form a stable layer 50 or 51, as illustrated in FIGS. 8*a* and *b*. Thus, it is possible to obtain a semiconductor device which is further stabilized in respect of the external atmosphere.

EXAMPLE 6

Another method of producing the semiconductor device according to this invention will be described with reference to FIGS. 9*a* to *d*.

Figure 9A:
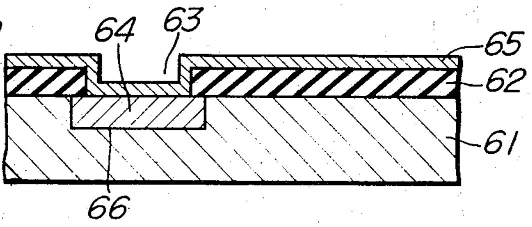
Figure 9B:
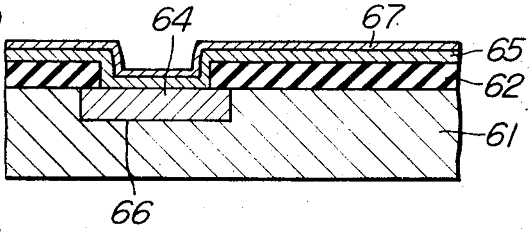

First, a P type silicon substrate 61 is prepared, as shown in FIG. 9*a*. This substrate is heated at 1000° C. in a wet $O_2$ gas atmosphere for two hours to form a silicon oxide film 62 about 6000 A. in thickness on the surface of the substrate 61. Subsequently, a hole 63 is formed in the film 62 at a suitable position by the photo-etching technique. Thereafter, the substrate is heated at 1100° C., and $POCl_3$ gas is supplied thereto for about 10 minutes to cause phosphorus to be diffused into the substrate 61 through the hole 63, thereby forming an N type diffusion region 64 about 3$\mu$ in depth and a PN junction 66. Through this diffusion treatment, a layer 65 consisting of phosphorus oxide or phosphorus oxide and silicon oxide is formed on that portion of the substrate which is exposed through the hole and on the silicon oxide film 62. Next, aluminum oxide or boron oxide is combined with the resulting layer 65 by any one of the various methods disclosed in the foregoing examples. For example, an aluminum layer as thin as about 500 A. is deposited on the layer 65 by the evaporation technique, and thus an aluminum oxide layer 67 is formed by effecting heat treatment at about 750° C. in an oxidizing atmosphere, as shown in FIG. 9*b*. In this case, the resultant aluminum oxide is strongly combined with mixture layer 65 consisting of phosphorus oxide or phosphorus oxide and silicon oxide, thus providing such as important function as to prevent the layer 65 containing phosphorus oxide from reacting with the moisture in the open air.

Figure 9C:
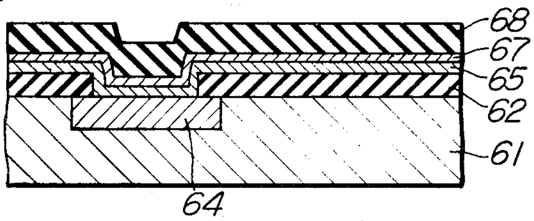

If it is required that a hole be formed through the insulating coating to reach the surface of the semiconductor substrate for the purpose of attaching an electrode to the semiconductor device thus produced, then, as shown in FIG. 9*c*, a silicon oxide layer 68 about 3000 to 6000

Figure 9D:
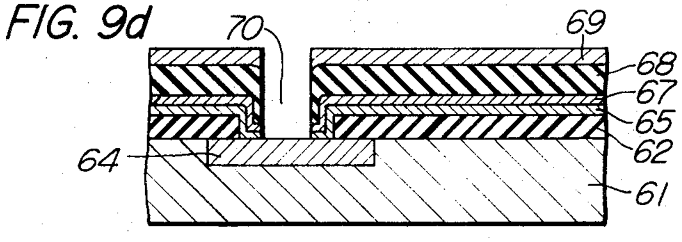

A. in thickness is deposited on the aluminum or boron oxide layer 67 through thermal decomposition of tetraethoxysilane, a photo-resist material 69 is applied on the silicon oxide layer 68, and thus a desired hole 70 is formed by a photo-etching technique as shown in FIG. 9*d*.

Figure 10A:
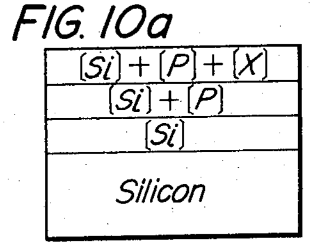
Figure 10B:
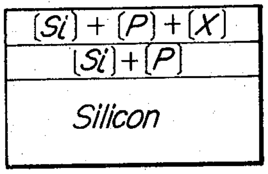
Figure 10C:
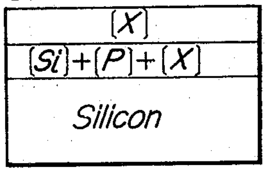

In the foregoing, the semiconductor device and the method of producing the same have been described in detail with reference to the concrete embodiments thereof. Now, a description will be made of various forms of the semiconductor device according to this invention with reference to the simplified diagrams of FIGS. 10*a* to *j*. Each of these diagrams shows the case where silicon is used as semiconductor substrate. It is to be noted that herein "silicon" refers to a silicon substrate. Also, [Si] represents silicon oxide, [P] phosphorus oxide, and [X] aluminum oxide or boron oxide. From this, it will be seen that the semiconductor device as shown in FIG. 10*a*, for exaample, comprises a silicon substrate, a silicon oxide layer provided on the silicon substrate, a layer consisting of silicon oxide and phosphorus oxide provided on the silicon oxide layer, and a layer consisting of silicon oxide, phosphorus oxide and aluminum or boron oxide. FIG. 10*c* shows a semiconductor device having a layer consisting of silicon oxide, phosphorus oxide and aluminum or boron oxide interposed between a silicon substrate and an aluminum or boron oxide layer. Similar explanation can also be made with reference to the other diagrams.

Figure 10D:
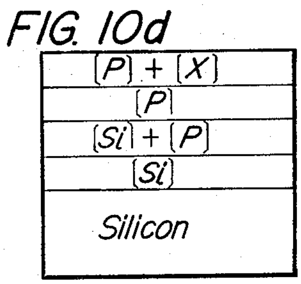
Figure 10E:
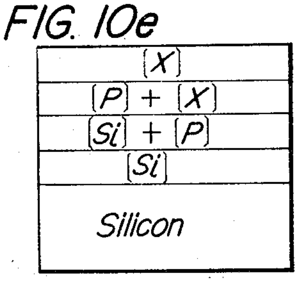

As described hereinbefore, the conditions which are considered to be desirable from the standpoint of the semiconductor surface stability and the water resisting property are added in the respective semiconductor devices according to the present invention. That is, in the semiconductor device having such a composition as shown in FIG. 10*a*, preferably, the layer [Si] is more than 3000 A. in thickness, the layer [Si]+[P] more than 50 A. in thickness, the layer [Si]+[P]+[X] more than 50 A. in thickness, and the quantity of aluminum or boron contained in the layer [Si]+[P]+[X] is not less than three times that of phosphorus contained therein on the basis of atomic percent. In FIG. 10*b*, preferably, the layer [Si]+[P] is more than 100 A. in thickness, the layer [Si]+[P]+[X] is more than 50 A. in thickness, and the quantity of aluminum or boron contained in the layer [Si]+[P]+[X] is not less than three times that of phosphorus contained therein on the basis of atomic percent. In FIG. 10*c*, it is preferabe that a layer [Si]+[P]+[X] is more than 100 A. in thickness, that the quantity of aluminum or boron contained in this layer is not more than three times that of phosphorus contained therein on the basis of atomic percent, and that a layer [X] is more than 50 A. in thickness. In FIG. 10*d*, it is preferable that a layer [Si] is more than 3000 A. in thickness, that layers [Si]+[P], [P] and [P]+[X] are more than 50 A. in thickness respectively, and that the quantity of aluminum or boron contained in the layer [P]+[X] is not less than three times that of phosphorus contained therein on the basis of atomic percent. In FIG. 10*e*, it is preferably that a layer [Si] is more than 3000 A. in thickness, that layers [Si]+[P],[P]+[X] and [X] are more than 50 A. in thickness respectively, and that the quantity of aluminum or boron contained in the layer [P]+[X] is not less than three times that of phosphorus contained therein on the basis of atomic percent.

Figure 10F:
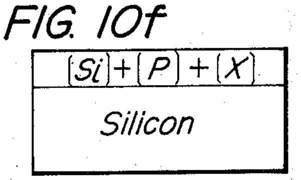
Figure 10G:
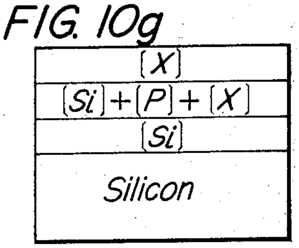
Figure 10H:
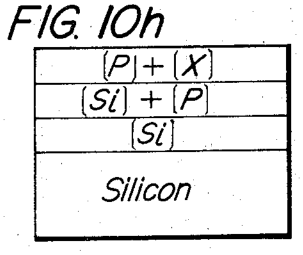
Figure 10I:
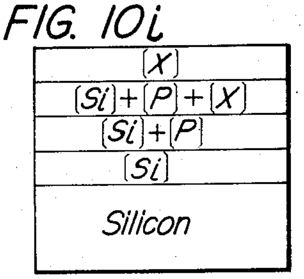
Figure 10J:
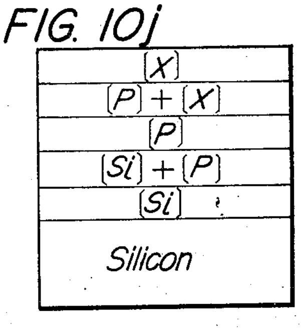

In a semiconductor device as shown in FIG. 10*f*, it is preferable that a layer [Si]+[P]+[X] is more than 100 A. in thickness, and that the quantity of aluminum or boron contained in this layer is not more than three times that of phosphorus contained therein on the basis of atomic percent. In FIG. 10*g*, it is preferable that a layer [Si] is more than 3000 A. in thickness, that layers [Si]+[P]+[X] and [X] are more than 50 A. in thickness respectively, and that the quantity of aluminum or boron contained in the layer [Si]+[P]+[X] is not more than three times that of phosphorus contained therein on the basis of atomic percent. In FIG. 10*h*, it is preferable that a layer [Si] is more than 3000 A. in thickness, that layers [Si]+[P] and [P]+[X] are more than 50 A. in thickness respectively, and that the quantity of aluminum or boron contained in the layer [P]+[X] is not less than three times that of phosphorus contained therein on the basis of atomic percent. In FIG. 10*i*, it is preferable that a layer [Si] is more than 3000 A. in thickness, that layers [Si]+[P], [Si]+[P]+[X] and [X] are more than 50 A. in thickness respectively, and that the quantity of aluminum or boron in the layer [Si]+[P]+[X] is not less than three times that of phosphorus contained therein on the basis of atomic percent. Furthermore, in a semiconductor device as shown in FIG. 10*j*, it is preferable that a layer [Si] is more than 3000 A. in thickness, that layer [Si]+[P], [P], [P]+[X] and [X] are more than 50 A. in thickness respectively, and that the quantity of aluminum or boron in the layer [P]+[X] is not less than three times that of phosphorus contained therein on the basis of atomic percent.

In an attempt to form an insulating film containing phosphorus oxide on a semiconductor substrate in the course of the manufacture of the semiconductor device according to this invention, use may be made of the following three methods other than the method described in detail with reference to FIGS. 3*a* and *b* or FIGS. 6*a* and *b*. The inventors have succeeded in the production of a semiconductor device having an excellent water resisting property, like the aforementioned devices, by causing aluminum oxide or boron oxide at least 50 A. in thickness to combine with the thus formed insulating layer containing phosphorus oxide at least 50 A. in thickness.

(i) A silicon oxide film more than 3000 A. in thickness is formed on a silicon substrate, and thereafter a very thin phosphorus oxide film about 200 A. in thickness is formed on the silicon oxide film through thermal decomposition of $POCl_3$, $PCl_5$, $PH_3$, $PBr_5$ or the like. At this time, the entire phosphorus oxide combines with the silicon oxide, so that a mixture of silicon oxide and phosphorus oxide or glass is produced.

(ii) A silicon oxide film is formed on a silicon substrate, and thereafter the substrate is heated at about 740° C. In such a state, by simultaneously supplying tetraethoxysilane and $POCl_3$ gases to the substrate together with $O_2$ gas used as carrier gas, a layer consisting of silicon oxide and phosphorus oxide or glass layer is formed in a thickness of 200 to 1000 A. directly on the silicon oxide film.

(iii) A cleanly washed silicon substrate having its surface exposed is heated at about 740° C. in a reaction tube, and $POCl_3$ and tetraethoxysilane gases are simultaneously supplied to the reaction tube together with $O_2$ gas. In this case, a layer consisting of silicon oxide and phosphorus oxide is formed directly on the surface of the silicon substrate.

While the invention has been particularly shown and described with reference to preferred embodiments, it will be understood by those skilled in the art that the foregoing and other changes in the form and details may be made therein without departing from the spirit and the scope of the invention.

What is claimed is:

1. In a semiconductor device including a semiconductor substrate of one conductivity type having a major surface, a semiconductor region of another conductivity type opposite to said one conductivity type formed in said major surface of said substrate, said region defining with said substrate of said one conductivity type a pn junction of which the edge portion extends to said major surface, and a protective film adhering to said major surface to cover at least said edge portion of said pn junction, the improvement characterized in that said protective film comprises a first layer adhering to said major surface of said semiconductor substrate and consisting substantially of silicon oxide, a second layer integrally combined with said first layer and including phosphorus oxide, and a third layer integrally combined with said second layer and including phosphorus oxide and aluminum oxide, the amount of the aluminum included in said third layer being not less than three times of the amount of the phosphorus included in said third layer in atomic ratio.

2. An improvement according to claim 1, wherein the amount of the aluminum included in said third layer is less than three times the amount of the phosphorus included in said second and third layer in atomic ratio.

3. A semiconductor device comprising a semiconductor substrate, a first insulating layer consisting essentially of silicon oxide formed on the surface of said semiconductor substrate, a second insulating layer consisting essentially of silicon oxide and phosphorus oxide covering said first insulating layer, and an insulating protecting coating essentially consisting of aluminum oxide covering said second insulating layer.

4. A semiconductor device comprising a semiconductor substrate having at least one exposed region on a major surface thereof, an insulating film formed on said surface of said semiconductor substrate and including silicon oxide and phosphorus oxide, and an inorganic moisture-protective coating formed directly on said insulating film for preventing said insulating film from reacting with moisture and thereby stabilizing the device, said coating essentially consisting of silicon oxide, phosphorus oxide and a metallic oxide selected from the group consisting of aluminum oxide and boron oxide.

5. A semiconductor device comprising a semiconductor substrate having at least one exposed region on a major surface thereof, and an inorganic moisture-protective passivating coating on said substrate for stabilizing the semiconductor device and preventing deterioration of its characteristics due to reaction with the atmosphere, said coating essentially consisting of silicon dioxide, phosphorus oxide and a metal oxide selected from the group consisting of aluminum oxide and boron oxide, the amount of said metal oxide being greater than 1% by weight of the coating.

6. A semiconductor device according to claim 5, wherein the amount of metal contained in said metal oxide is less than three times that of phosphorus on the basis of atomic percent.

7. A semiconductor device according to claim 5, further comprising another layer essentially consisting of said metal oxide on said moisture-protective passivating coating.

8. A semiconductor device according to claim 5, wherein said substrate essentially consists of silicon oxide.

9. A semiconductor device according to claim 5, wherein a further layer of silicon oxide is interposed between said substrate and said coating.

10. A semiconductor device according to claim 9, wherein said substrate essentially consists of silicon oxide.

11. A semiconductor device comprising a semiconductor substrate, and several layers on said substrate including a first insulating layer essentially consisting of silicon oxide formed on a major surface of the substrate, a second insulating layer containing phosphorus oxide formed on said first insulating layer, a third moisture protective layer directly formed on said second insulating layer and containing phosphorus oxide an aluminum oxide, with the quantity of aluminum present in the third layer being not less than three times that of phosphorus contained therein on the basis of atomic percent, and a fourth moisture-protective layer essentially consisting of aluminum oxide formed on said third layer.

12. In a semiconductor device including a semiconductor substrate of one conductivity type having a major surface, a semiconductor region of another conductivity type opposite to said one conductivity type formed in said major surface of said substrate, said region defining with said substrate of said one conductivity type a pn junction of which the edge portion extends to said major surface, and a protective film adhering to said major surface to cover at least said edge portion of said pn junction, the improvement characterized in that said protective film comprises a first layer adhering to said major surface of said semiconductor substrate and consisting substantially of silicon oxide, a second layer integrally combined with said first layer and including phosphorous oxide, and a third layer integrally combined with said second layer and including phosphorus oxide and an oxide of at least one element selected from the group consisting of aluminum and boron, the amount of the element selected from said group included in said third layer being not less than three times of the amount of the phosphorus included in said third layer in atomic ratio.

13. An improvement according to claim 12, wherein the amount of the element selected from said group included in said third layer is less than three times the amount of the phosphorus included in said second and third layer in atomic ratio.

14. An improvement according to claim 12, wherein said protective film further comprises a fourth layer of aluminum oxide integrally united to said third layer.

15. In a semiconductor device comprising a semiconductor substrate and an insulating layer covering a surface of said substrate, the improvement characterized in that said insulating layer consists substantially of silicon oxide, phosphorus oxide and aluminum oxide, the amount of the aluminum included in said insulating layer being more than one percent of the total amount of silicon, phosphor and aluminum included in said insulating layer but less than three times of the amount of the phosphor included in said insulating layer in atomic ratio.

16. A semiconductor device comprising a semiconductor substrate, an insulating film consisting substantially of silicon oxide and phosphorus oxide formed on a surface of said semiconductor substrate, and an inorganic protective coating essentially consisting of aluminum oxide on said insulating film.

17. A semiconductor device according to claim 16, wherein said protective coating further includes phosphorus oxide.

18. A semiconductor device comprising a semiconductor substrate, a first insulating layer consisting essentially of silicon oxide formed on the surface of said semicontor substrate, a second insulating layer consisting essentially of silicon oxide and phosphorus oxide covering said first insulating layer, and an insulating protecting coating including as a major constituent aluminum oxide covering directly said second insulating layer.

19. A semiconductor device comprising a semiconductor substrate having a major surface, a first insulating layer consisting essentially of silicon oxide formed on said major surface, a second insulating layer consisting essentially of silicon oxide and phosphorus oxide formed on said first insulating layer, a third insulating layer consisting essentially of phosphorus oxide formed on said second insulating layer, and an insulating moisture protective coating including aluminum oxide covering said third insulating layer.

20. A semiconductor device comprising a semiconductor substrate, an insulating film formed on a surface of said semiconductor substrate and composed substantially of silicon oxide, phosphorus oxide and aluminum oxide, and an inorganic protective coating including as a major constituent aluminum oxide formed on said insulating film.

21. A semiconductor device comprising a semiconductor substrate, an insulating film formed on a surface of said semiconductor substrate and composed substantially of silicon oxide, phosphorus oxide and boron oxide, and an inorganic protective coating including as a major constituent aluminum oxide formed on said insulating film.

22. A semiconductor device comprising a semiconductor substrate of a first conductivity type having a major surface, a semiconductor region of a second conductivity type opposite to said first conductivity type formed in said major surface of said substrate, said region defining with said substrate of said first conductivity type a pn junction, of which an end portion terminates at said major surface, a first insulating layer formed on said major surface of said semiconductor substrate and consisting essentially of silicon oxide, a second insulating layer integrally combined with said first insulating layer and including phosphorus oxide, and a third moisture-protective insulating layer integrally combined with said second insulating layer and including as a major constituent aluminum oxide, said end portion of said pn junction being covered with said first, second and third insulating layers.

23. A semiconductor device according to claim 22, further comprising a second semiconductor region of said first conductivity type formed in a surface portion of said major surface defined by said semiconductor region of said second conductivity type, said second semiconductor region defining with said semiconductor region of said second conductivity type a second pn junction of which an end portion terminates at said major surface, said end portion of said second pn junction being covered with said third insulating layer.

24. A semiconductor device according to claim 22, further comprising a fourth insulating layer consisting essentially of silicon oxide formed on said third insulating layer.

25. A semiconductor device according to claim 22, wherein said third insulating layer further includes phosphorus oxide.

26. A semiconductor device according to claim 25, further comprising a fourth insulating layer consisting essentially of aluminum oxide formed on said third insulating layer.

27. A semiconductor device according to claim 26, further comprising a fifth insulating layer consisting essentially of silicon oxide covering said fourth insulating layer.

28. A semiconductor device comprising a semiconductor substrate of a first conductivity type having a major surface, a semiconductor region of a second conductivity type opposite to said first conductivity type formed in said major surface of said substrate, said region defining with said substrate of said first conductivity type a pn junction, of which an end portion terminates at said major surface, a first insulating film formed on said major surface of said semiconductor substrate and consisting essentially of silicon oxide, a second insulating film integrally combined with said first insulating film and consisting essentially of silicon oxide and phosphorus oxide, a third insulating film including phosphorus oxide and aluminum oxide covering said second insulating film, and a fourth insulating film consisting essentially of aluminum oxide integrally combined with said third insulating film, said end portion of said pn junction being covered with said first, second, third and fourth insulating films.

29. A semiconductor device according to claim 28, further comprising a second semiconductor region of said first conductivity type formed in a surface portion of said major surface defined by said semiconductor region of said second conductivity type, said second semiconductor region defining with said semiconductor region of said second conductivity type a second pn junction of which end portion terminates at said major surface, said end portion of said second pn junction being covered with said fourth insulating film.

30. A semiconductor device according to claim 28, further comprising a fifth insulating film consisting essentially of silicon oxide formed on said fourth insulating film.

31. A semiconductor device comprising a semiconductor substrate of a first conductivity type having a major surface, a semiconductor region of a second conductivity type opposite to said substrate, said region defining with said substrate of said first conductivity type a pn junction, of which an end portion terminates at said major surface, a first insulating film consisting essentially of silicon oxide formed on said major surface of said semiconductor substrate, a phospho-silicate glass layer integrally combined with said first insulating film, a phospho-alumino glass film including phosphorus oxide and aluminum oxide covering said phospho-silicate glass film, and a second insulating film consisting essentially of aluminum oxide covering said phospho-alumino glass film, said end portion of said pn junction being covered with said phospho-alumino glass film.

32. A semiconductor device according to claim 31, further comprising a third insulating film consisting essentially of silicon oxide formed on said second insulating film.

33. A semiconductor device according to claim 31, further comprising a second semiconductor region of said first conductivity type formed in a surface portion of said major surface defined by said semiconductor region of said second conductivity type, said second semiconductor region defining with said semiconductor region of said second conductivity type a second pn junction, of which an end portion terminates at said major surface, said end portion of said second pn junction being covered with said phospho-alumino glass film.

34. A semiconductor device comprising a semiconductor substrate of a first conductivity type having a major surface, a semiconductor region of a second conductivity type opposite to said first conductivity type formed in said major surface of said substrate, said region defining with said substrate of said first conductivity type a pn junction, of which an end portion terminates at said major surface, a first insulating film consisting essentially of silicon oxide formed on said major surface of said semiconductor substrate, at second vitrified insulating film including silicon oxide and phosphorus oxide integrally combined with said first insulating film, and a third vitrified insulating film including phosphorus oxide and aluminum oxide covering said second vitrified insulating film, said end portion of said pn junction being covered with said first, second and third insulating films.

35. A semiconductor device according to claim 34, further comprising a second semiconductor region of said first conductivity type formed in a surface portion of said major surface defined by said semiconductor region of said second conductivity type, said second semiconductor region defining with said semiconductor region of said second conductivity type a second pn junction of which end portion terminates at said major surface, said end portion of said second pn junction being covered with said first, second and third insulating films.

36. A semiconductor device according to claim 34, further comprising a fourth insulating film consisting essentially of a silicon compound formed on said third insulating film, a hole provided through said first, second, third and fourth insulating films to expose a portion of said major surface, and an electrode means connected to the exposed portion of said major surface.

37. A semiconductor device comprising a semiconductor substrate, and several layers on said substrate including a first insulating layer formed on a surface of said substrate and containing phosphorus oxide, and a second moisture protective layer on said first layer containing phosphorus oxide and including a further oxide selected from the group consisting of aluminum oxide and boron oxide, with the quantity of aluminum or boron present in the second layer being not less than three times that of phosphorus contained therein on the basis of atomic percent.

38. A semiconductor device according to claim 37, wherein said second layer is formed directly on the first layer.

39. A semiconductor device according to claim 38, wherein another moisture-protective layer essentially consisting of an oxide selected from the group consisting of aluminum and boron oxide is formed on said second layer.

40. A semiconductor device according to claim 39, wherein said substrate essentially consists of silicon oxide.

41. A semiconductor device according to claim 37, wherein another moisture-protective layer essentially consists of an oxide selected from the group consisting of aluminum and boron oxide is formed on said second layer.

References Cited

UNITED STATES PATENTS

| | | | |
|---|---|---|---|
| 3,212,921 | 10/1965 | Pliskin et al. | 117—201 |
| 3,309,245 | 3/1967 | Haenichen | 148—187 |
| 3,334,281 | 8/1967 | Ditrick | 148—187 |
| 3,343,049 | 9/1967 | Miller et al. | 148—187 |
| 3,408,238 | 10/1968 | Sanders | 148—187 |
| 3,415,680 | 12/1968 | Perri et al. | 117—215 |
| 3,457,125 | 7/1969 | Kerr | 148—187 |
| 3,476,619 | 11/1969 | Tolliver | 148—187 |

L. DEWAYNE RUTLEDGE, Primary Examiner

J. M. DAVIS, Assistant Examiner

U.S. Cl. X.R.

29—588; 117—215; 148—1.5, 187, 188